United States Patent
Tsuda

(10) Patent No.: US 9,536,649 B2
(45) Date of Patent: Jan. 3, 2017

(54) MRI APPARATUS, OPERATION METHOD THEREOF, AND QUENCHING PREVENTION DEVICE

(75) Inventor: Munetaka Tsuda, Tokyo (JP)

(73) Assignee: HITACHI, LTD., Tokyo (JP)

( * ) Notice: Subject to any disclaimer, the term of this patent is extended or adjusted under 35 U.S.C. 154(b) by 554 days.

(21) Appl. No.: 14/237,727

(22) PCT Filed: Sep. 5, 2012

(86) PCT No.: PCT/JP2012/072534
§ 371 (c)(1),
(2), (4) Date: Feb. 7, 2014

(87) PCT Pub. No.: WO2013/038960
PCT Pub. Date: Mar. 21, 2013

(65) Prior Publication Data
US 2014/0171329 A1    Jun. 19, 2014

(30) Foreign Application Priority Data

Sep. 14, 2011   (JP) .................................. 2011-200923

(51) Int. Cl.
*G01V 3/00*      (2006.01)
*H01F 6/02*      (2006.01)
*G01R 33/28*     (2006.01)
*G01R 33/3815*   (2006.01)
*G01R 33/385*    (2006.01)

(52) U.S. Cl.
CPC ............... *H01F 6/02* (2013.01); *G01R 33/288* (2013.01); *G01R 33/3815* (2013.01); *G01R 33/385* (2013.01)

(58) Field of Classification Search
CPC .............. G01R 33/3415; G01R 33/543; G01R 33/5659; G01R 33/36; A61B 5/055

USPC .......................................................... 324/307
See application file for complete search history.

(56) References Cited

U.S. PATENT DOCUMENTS

| | | | |
|---|---|---|---|
| 5,606,300 A | 2/1997 | Koyama et al. | |
| 2010/0069738 A1* | 3/2010 | Timinger | G01R 33/288 600/410 |
| 2012/0066895 A1 | 3/2012 | Tsuda | |

FOREIGN PATENT DOCUMENTS

| | | |
|---|---|---|
| JP | 6-188119 | 7/1994 |
| JP | 2010-508936 | 3/2010 |
| WO | WO2010/143603 | 12/2010 |

OTHER PUBLICATIONS

International Search Report in PCT/JP2012/072534.

* cited by examiner

*Primary Examiner* — Walter L Lindsay, Jr.
*Assistant Examiner* — Frederick Wenderoth
(74) *Attorney, Agent, or Firm* — Cooper & Dunham LLP

(57) ABSTRACT

In order to prevent quenching caused accidentally in a superconducting magnet, an MRI apparatus vibrates the superconducting magnet in order to prevent quenching of the superconducting magnet in a time period for which a predetermined imaging sequence is not executed (step 210). As a specific method, a gradient magnetic field may be generated by a gradient magnetic field coil for an imaging sequence of the MRI apparatus, or a gradient magnetic field may be generated using a gradient magnetic field coil for vibration provided apart from the gradient magnetic field coil for an imaging sequence. In addition, in a period for which the predetermined imaging sequence is not executed, a phantom may be imaged to prevent the quenching of the superconducting magnet.

20 Claims, 6 Drawing Sheets

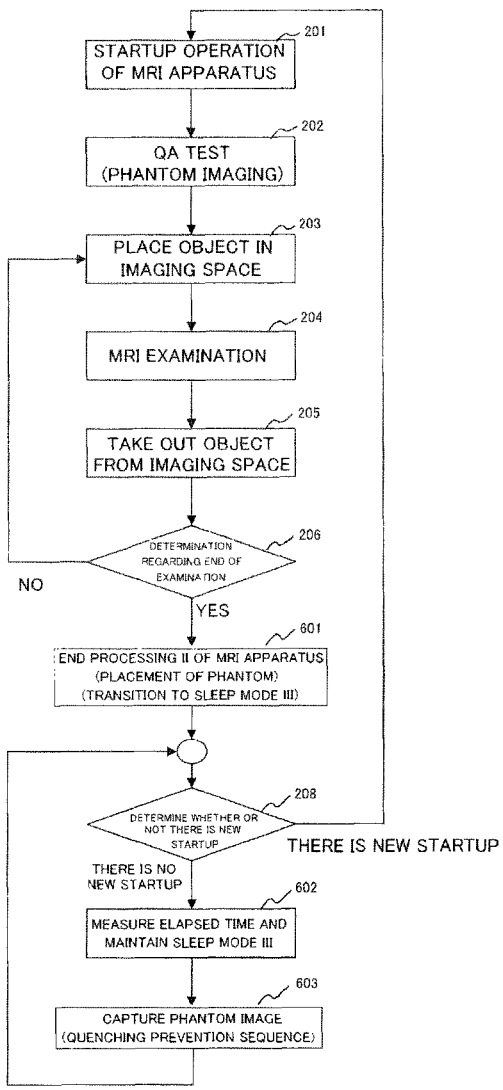

MRI APPARATUS, OPERATION METHOD THEREOF, AND QUENCHING PREVENTION DEVICE

TECHNICAL FIELD

The present invention relates to a magnetic resonance imaging apparatus (hereinafter, referred to as an MRI apparatus) using a superconducting magnet, and in particular, to an MRI apparatus using a superconducting magnet with high energy stored therein.

BACKGROUND ART

In the MRI apparatus, a superconducting magnet is used as a source of strong static magnetic field. For the superconducting magnet, a superconducting coil is formed by winding the superconducting wire around the coil bobbin, a thermosetting epoxy resin is filled and hardened in the gap of the superconducting wire, and then the superconducting coil is cooled to a temperature (usually, 4.2 Kelvin (−268.8° C.) that is a boiling point of liquid helium) at which the transition to the superconducting state occurs. After the cooling, a current is supplied to the superconducting coil, and a circuit called a superconducting switch is closed in a state of having reached the rated magnetic field. As a result, a closed loop state in which a permanent current flows is realized. In this manner, it is possible to maintain the superconducting state.

However, when the superconducting wire of the superconducting coil moves several micrometers or the cracking occurs in the resin that solidifies the superconducting wire in the permanent current mode, the local heat generation occurs. When the temperature of the superconducting wire exceeds a critical temperature due to the heat generation, the transition from the superconducting state to the normal conducting state (quenching) occurs. In order to prevent sudden quenching from occurring while the permanent current is held for a long time, PTL 1 proposes that the aging of the internal structure of the superconducting coil is substantially accelerated in advance by repeating the excitation and demagnetization of the superconducting magnet or making the overcurrent flow.

CITATION LIST

Patent Literature

[PTL 1] JP-A-2006-324411

SUMMARY OF INVENTION

Technical Problem

However, even in the superconducting magnet in which the aging of the internal structure of the superconducting coil is substantially accelerated in advance by repeating the excitation and demagnetization of the superconducting magnet or making the overcurrent flow as disclosed in PTL 1, quenching from unknown causes (referred to as accidental quenching) may occur in the subsequent period. When accidental quenching occurs, a large amount of liquid helium is vaporized, and the MRI apparatus cannot be used for some period of time. Accordingly, it is necessary to perform a series of maintenance work in which a large amount of liquid helium is urgently purchased and supplied into the superconducting magnet and the superconducting coil is cooled again to realize the superconducting state.

For this reason, in the medical institution where the MRI apparatus is installed, if accidental quenching occurs, the examination that requires the MRI apparatus can be cancelled at the last minute and also the cost of the liquid helium or the maintenance work is increased because the superconducting magnet may have to be restarted.

It is an object of the present invention to prevent quenching that may be caused accidentally in the superconducting magnet.

Solution to Problem

In order to achieve the above-described object, according to the present invention, there is provided a magnetic resonance imaging apparatus including: a superconducting magnet; a gradient magnetic field coil that applies a gradient magnetic field to imaging space; a high-frequency coil that applies a high-frequency magnetic field to the imaging space; a control unit that controls operations of the gradient magnetic field coil and the high-frequency coil to execute a predetermined imaging sequence; and a quenching prevention sequence execution unit that executes a quenching prevention sequence to vibrate the superconducting magnet in a time period for which the control unit does not execute the imaging sequence.

Advantageous Effects of Invention

According to the present invention, since it is possible to prevent accidental quenching in the superconducting magnet, the MRI apparatus can be operated stably in a medical facility, and thus, the reliability of the apparatus or the examination is improved. By eliminating the unplanned maintenance work of the superconducting magnet, it is possible to reduce maintenance costs.

BRIEF DESCRIPTION OF DRAWINGS

FIG. 6 is a flowchart showing the operation in a third embodiment of the present invention.

DESCRIPTION OF EMBODIMENTS

Figure 1:
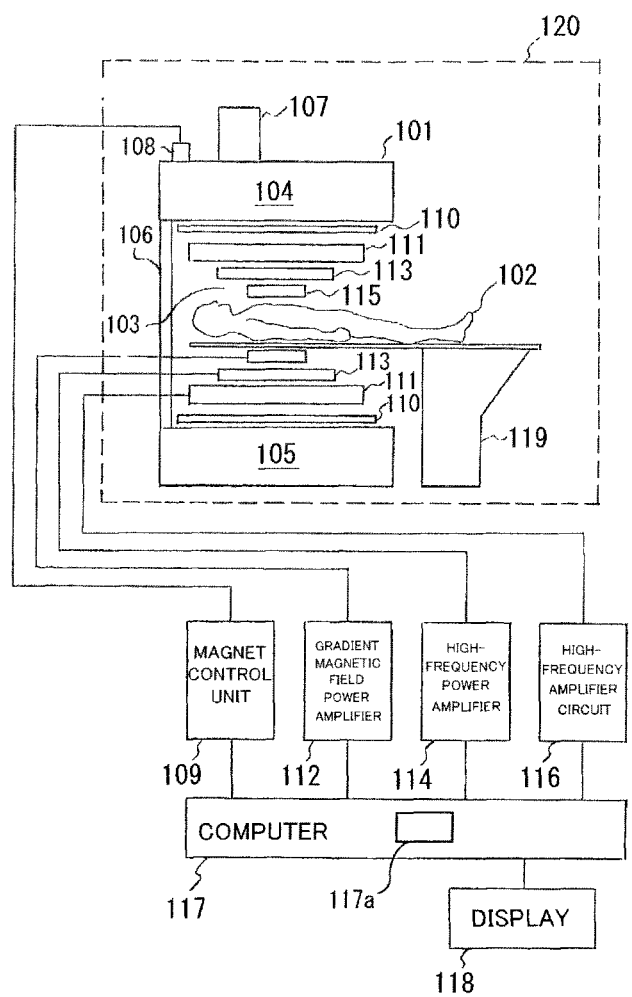
FIG. 1 is a block diagram showing the overall configuration of an MRI apparatus of a first embodiment of the present invention.

The inventors analyzed the cases of MRI apparatuses in which accidental quenching occurred. As a result, they found out that the type of a superconducting magnet that had high frequency of occurrence of accidental quenching was a high magnetic field superconducting magnet with large magnetic field strength and high energy stored in a superconducting coil or a superconducting magnet having an open structure in which a pair of superconducting magnets were disposed opposite each other. In addition, it was found that a time or day when accidental quenching was likely to occur was night or a holiday when the MRI apparatus was not operated for an examination.

Then, in the further analysis result for the superconducting coil with high energy stored, it was found that the main cause of accidental quenching was the creeping of resin (for example, thermosetting epoxy resin) filling in the gap of the superconducting wire progressed and a sudden crack occurred when the resin was stretched.

That is, when the stress of thermal contraction strain is applied to the resin, which is filled to fix the superconducting wire of the superconducting coil, due to cooling by liquid helium, the creeping is caused. As the creeping progresses and the creep strain increases, a crack occurs in the resin. When the MRI apparatus is paused, the superconducting magnet is allowed to stand. Accordingly, the creep strain of the resin increases gradually, and a large crack occurs at the stretch due to the increased strain. Since the superconducting coil near the crack is heated by the energy generated when a large crack occurs, quenching occurs. For example, when a crack of 30 mm in length occurs, the temperature rises to 6 Kelvin (−267° C.) When a large permanent current flows with the large magnetic field strength, 6 Kelvin is a temperature approximately equal to the critical temperature at which the superconducting wire transitions to the normal conducting state.

In addition, the reason for the accidental quenching occurring often at night or on a holiday is as follows. When the MRI apparatus is operating, that is, is capturing an image, a pulsed gradient magnetic field is repeatedly applied by execution of the imaging sequence, and the superconducting magnet performs minute vibration constantly due to the electromagnetic force. Due to this minute vibration, in addition to the creep strain, elastic strain is superimposed in the resin. With this as a trigger, a crack occurs in the resin in a stage in which the creep strain is small. If a crack is small (30 mm or less), a temperature rise is also small. Therefore, even in the superconducting coil with high energy stored therein, the critical temperature at which the superconducting wire transitions to the normal conducting state is not exceeded.

In view of the above, it is an object of the present invention to prevent accidental quenching with an MRI apparatus having the following configuration, stabilize the MRI apparatus, and improve the reliability of the examination.

An MRI apparatus of the present invention includes: a superconducting magnet; a gradient magnetic field coil that applies a gradient magnetic field to imaging space; a high-frequency coil that applies a high-frequency magnetic field to the imaging space; and a control unit that controls operations of the gradient magnetic field coil and the high-frequency coil execute a predetermined imaging sequence, and further includes a quenching prevention sequence execution unit that executes a quenching prevention sequence to vibrate the superconducting magnet in a time period for which the control unit does not execute the imaging sequence.

By executing the quenching prevention sequence to vibrate the superconducting magnet in a time period for which the control unit does not execute the imaging sequence as described above, it is possible to prevent quenching accidentally caused in the superconducting magnet.

The quenching prevention sequence may be configured to vibrate the superconducting magnet by driving the gradient magnetic field coil to apply a gradient magnetic field to the superconducting magnet, or a coil for vibration that applies a gradient magnetic field for vibrating the superconducting magnet to the superconducting magnet may be disposed apart from the gradient magnetic field coil.

By executing, as the quenching prevention sequence, a sequence of applying alternating gradient magnetic fields with opposite gradient directions to the superconducting magnet, it is possible to vibrate the superconducting magnet. In this case, when a frequency of the alternating gradient magnetic field or a frequency of the harmonic matches a resonance frequency of the superconducting magnet, the superconducting magnet can resonate. Therefore, it is possible to generate vibration effectively.

In addition, an imaging sequence may be executed as the quenching prevention sequence. In addition, a phantom imaging sequence of capturing a phantom and performing predetermined image analysis is generally performed in order to adjust the apparatus before executing a predetermined imaging sequence. Accordingly, the same imaging sequence as the phantom imaging sequence may be executed as the quenching prevention sequence. In this case, it is possible to adjust the apparatus in a short period from the start by making the quenching prevention sequence serve as the phantom imaging sequence and making the control unit perform the image analysis using an image captured in advance by the quenching prevention sequence.

The quenching prevention sequence execution unit may be configured to execute the quenching prevention sequence repeatedly at predetermined time intervals during a time period for which the imaging sequence is not executed, or the quenching prevention sequence may be executed at a certain timing.

The quenching prevention sequence execution unit notifies an object or an operator that the quenching prevention sequence is about to be executed before executing the quenching prevention sequence, thereby being able to prevent the object or the operator from being surprised by the vibration sound of the superconducting magnet according to the execution of the quenching prevention sequence. In addition, the quenching prevention sequence execution unit may include a detection section configured to detect that an object or an operator is in a predetermined range around the superconducting magnet before executing the quenching prevention sequence. When it is detected that an object or an operator is in the vicinity, it is also possible to delay the execution of the quenching prevention sequence.

In addition, an MRI apparatus according to another aspect of the present invention includes: a superconducting magnet; a gradient magnetic field coil that applies a gradient magnetic field to imaging space; a high-frequency coil that applies a high-frequency magnetic field to the imaging space; and a control unit that controls operations of the gradient magnetic field coil and the high-frequency coil to execute a predetermined imaging sequence. The control unit may be configured to execute a predetermined imaging sequence for vibration in order to vibrate the superconducting magnet in a time period for which the imaging sequence is not executed. Therefore, since the superconducting magnet vibrates from the execution of the imaging sequence for vibration, it is possible to prevent accidental quenching.

In addition, in the present invention, as an operation method of an MRI apparatus that includes a superconducting magnet and images an object by executing a predetermined imaging sequence, there is provided a method of vibrating the superconducting magnet in order to prevent quenching of the superconducting magnet in a time period for which the predetermined imaging sequence is not executed. Therefore, it is possible to prevent accidental quenching.

In this case, the superconducting magnet may be vibrated by generating a gradient magnetic field in a gradient magnetic field coil for an imaging sequence of the MRI apparatus, or a gradient magnetic field may be generated using a gradient magnetic field coil for vibration provided apart from the gradient magnetic field coil for an imaging sequence of the MRI apparatus.

In the present invention, as an operation method of a magnetic resonance imaging apparatus that includes a superconducting magnet and images an object by executing a predetermined imaging sequence, there is provided an operation method of imaging a phantom, in order to prevent quenching of the superconducting magnet in a time period for which the predetermined imaging sequence is not executed. Since the superconducting magnet vibrates at the time of imaging of the phantom, it is possible to prevent accidental quenching.

In addition, in the present invention, as an operation method of a magnetic resonance imaging apparatus including a superconducting magnet, there is provided an operation method including: a step of imaging an object; a step of performing an operation to pause the imaging; and a step of vibrating the superconducting magnet after the pause operation is performed. By vibrating the superconducting magnet, it is possible to prevent accidental quenching.

In addition, in the present invention, there is also provided a quenching prevention device of a magnetic resonance imaging apparatus including a superconducting magnet. This device includes a gradient magnetic field coil for vibration that generates a gradient magnetic field for vibrating the superconducting magnet; and a current supply unit that performs an operation, which is for supplying an alternating current to the gradient magnetic field coil for vibration for a predetermined time, repeatedly at predetermined time intervals. By placing the quenching prevention device in the MRI apparatus or the examination room, it is possible to prevent accidental quenching of the superconducting magnet of the MRI apparatus.

An example of a specific embodiment of the present invention will be described with reference to the diagrams.

First Embodiment

Hereinafter, an MRI apparatus of a first embodiment of the present invention will be specifically described with reference to the accompanying diagrams.

In addition, in all diagrams for explaining the embodiments of the invention, the same reference numerals are given to components having the same functions, and repeated explanation thereof will be omitted.

(Configuration of an MRI Apparatus)

First, the configuration of an MRI apparatus of the present embodiment will be described.

FIG. 1 shows the entire configuration in a state where the MRI apparatus of the present embodiment is installed in a medical facility.

The MRI apparatus includes a superconducting magnet 101 having an open structure as a magnet that generates a static magnetic field.

The superconducting magnet 101 of the open structure includes an upper cryostat 104 and a lower cryostat 105 that are disposed up and down with imaging space 103, in which an object 102 is disposed, interposed therebetween. A superconducting coil (not shown in FIG. 1) serving as a source of magnetomotive force is provided inside each of the upper cryostat 104 and the lower cryostat 105. The upper cryostat 104 and the lower cryostat 105 are connected to each other by a connecting pipe 106 serving as a strut, and the upper cryostat 104 is supported by the connecting pipe 106 with respect to the lower cryostat 105. In this case, the superconducting magnet 101 has an open structure in which the front, rear, left, and right sides of the imaging space 103 are empty. Therefore, since the feeling of pressure given to the object 102 is reduced, it is possible to provide a friendly examination environment.

An example of the specific structure of the superconducting magnet 101 will be described with reference to FIG. 2. An outermost portion of each of the upper cryostat 104 and the lower cryostat 105 of the superconducting magnet 101 is a vacuum container 401 formed of a stainless steel plate (for example, 18 mm in thickness). Inside the vacuum container 401, a helium container 403 formed of a stainless steel plate (for example, 15 mm in thickness) is disposed with a vacuum layer 402 interposed therebetween. In order to fix the helium container 403 to the vacuum container 401, a plurality of load supports 104 are provided. The Load support 404 is formed of a material having high heat insulation (for example, fiber-reinforced plastic resin (FRP)) so that heat is not transferred to the helium container 403.

In each helium container 403 of the upper cryostat 104 and the lower cryostat 105, one or more superconducting coils 405 are disposed symmetrically with respect to the imaging space 103 interposed therebetween. The superconducting coil 405 is firmly fixed to the helium container 403 by a support bracket 406. Although FIG. 2 shows an example in which one superconducting coil 405 is disposed in each of the upper and lower helium containers 403, it is also possible to dispose a group of superconducting coils in each of the upper and lower helium containers 403 in order to improve the magnetic field homogeneity of the imaging space 103 and in order to reduce the strength of a magnetic field leaking to the vicinity.

The helium container 403 is filled with liquid helium 407, and the superconducting coil 405 is cooled at 4.2 Kelvin (−268.8° C.) that is the boiling temperature of the liquid helium 407. Due to this cooling, the superconducting coil 405 maintains the superconducting state so that a permanent current (for example, 450 A) flows stably, thereby generating a magnetic field (for example, one Tesla) in the imaging space 103.

A radiation shield plate 408 (for example, 5 mm-thick aluminum) is disposed at an intermediate position of the vacuum layer 402 between the vacuum container 401 and the helium container 403. The radiation shield plate 408 suppresses the radiant heat from the vacuum container 401 to the helium container 403, thereby suppressing the consumption of the liquid helium 407. Due to the load support 404 and the radiation shield plate 408 of the heat-insulating structure described above, the amount of heat entering the helium container 403 is suppressed to about several watts.

A cryocooler 107 is provided in an upper portion of the upper cryostat 104 of the superconducting magnet 101. The cryocooler 107 cools the helium gas vaporized within the upper cryostat 104 and the lower cryostat 105 to make liquid helium again, and returns the liquid helium into the upper cryostat 104. In addition, a cooling portion of the cryocooler 107 cools the radiant heat shielding plate 408 and the helium container 403. Thus, by compensating for the amount of heat entering the helium container 403 with the cooling capacity of the cryocooler 107, the closed type superconducting magnet 101 is formed. Accordingly, the consumption of liquid helium for cooling the superconducting coil is suppressed.

On each surface of the upper cryostat 104 and the lower cryostat 105 facing the imaging space 103, a shim plate 110, a gradient magnetic field coil 111, and a high-frequency coil 113 are disposed. In addition, a bed 119 for inserting the object 102 into the imaging space 103 is disposed on the side of the lower cryostat 105. A detection coil 115 is attached to the object 102. In addition, the MRI apparatus includes a magnet control unit 109, a gradient magnetic field power amplifier 112, a high-frequency power amplifier 114, a high-frequency amplifier circuit 116, a computer 117, and a display 118 as a control and operation system. The computer 117 is configured to include a control unit that controls the operation of the gradient magnetic field coil 111, the high-frequency coil 113, and the like to execute a predetermined imaging sequence and a quenching prevention sequence execution unit (hereinafter, referred to as a quenching prevention unit) 117a that executes a quenching prevention sequence to vibrate a superconducting magnet in a time period for which the imaging sequence is not executed by the control unit.

In addition, a plurality of temperature sensors or pressure sensors (not shown in the diagrams) for monitoring the operating state are provided in the superconducting magnet 101, and connecting terminals 108 of these sensors are pulled out above the upper cryostat 104 and are connected to the magnet control unit 109. In addition, a pipe called a service port 409 for the replenishment of the liquid helium 407 or the exhaust of helium gas is provided in an upper portion of the vacuum container 401 of the upper cryostat 104.

The shim plate 110 and the gradient magnetic field coil 111 are fixed to the surface of the vacuum container 401 of each of the upper and lower cryostats 104 and 105 facing the imaging space 103 by a fixing bolt 410.

A plurality of screw holes (not shown in the diagrams) are opened in the shim plate 110, and screws of magnetic material are embedded into screw holes at appropriate positions of the plurality of screw holes. The shim plate 110 improves the magnetic field homogeneity to the target value (for example, 3 ppm or less) by finely changing the distribution of the magnetic flux generated by the superconducting magnet 101 to adjust the magnetic field homogeneity.

A pair of gradient magnetic field coils 111 are disposed on the surfaces of a pair of shim plates 110 facing the imaging space 103. The gradient magnetic field coil 111 has a flat plate structure so as not to interfere with the open structure of the superconducting magnet 101.

Each of the pair of gradient magnetic field coils 111 has a configuration in which three kinds of coils, which generate gradient magnetic fields in three axial directions of xyz perpendicular to each other, are laminated. The gradient magnetic field power amplifier 112 is connected to the three kinds of coils, and a current is applied independently thereto. For example, when a positive current is applied from the gradient magnetic field power amplifier 112 to upper and lower z coils, the upper z coil generates a magnetic flux in the same direction as the magnetic flux generated by the superconducting magnet 101, and the lower z coil generates a magnetic flux in the opposite direction to the magnetic flux generated by the upper z coil. As a result, a gradient is generated in which the magnetic flux density decreases gradually from top to bottom of the Z axis (vertical axis) of the imaging space 103.

Similarly, the x and y coils have a function of giving a gradient so as to change the density of the magnetic flux generated by the superconducting magnet 101 along the x and y axes (both are horizontal axes), respectively. In the present embodiment, the gradient magnetic field coil 111 is formed so that the gradient of 50 mT per meter is generated independently in the three axes of xyz when a current of, for example, 500 A is applied from the gradient magnetic field power amplifier 112.

The pair of high-frequency coils 113 are coils having a flat plate structure, and are attached to the pair of gradient magnetic field coils 111 on the side of the imaging space 103. The high-frequency power amplifier 114 is connected to the pair of upper and lower high-frequency coils 113 so that a high-frequency current is supplied. As a result, the pair of high-frequency coils 113 generate a high-frequency magnetic field causing a nuclear magnetic resonance phenomenon in the nuclear spins of the examination part of the object 102. In the present embodiment, for example, a high-frequency magnetic field of 42 MHz required when hydrogen nuclei cause the nuclear magnetic resonance phenomenon at the magnetic field strength of 1 Tesla is generated.

When a gradient magnetic field and a high-frequency magnetic field are combined, hydrogen nuclei present in the examination part of the object 102 cause a nuclear magnetic resonance phenomenon selectively. Then, in the subsequent precession process of the nuclear spins, a gradient magnetic field is applied in a pulsed manner. As a result, three-dimensional position information is added to the precession of the nuclear spins.

The detection coil 115 is disposed in an examination part of the object 102, which is a central position of the imaging space 103, and detects the precession of the nuclear spins as a nuclear magnetic resonance signal. The output signal of the detection coil 115 is amplified by the high-frequency amplifier circuit 116, detected, and converted into a digital signal. The computer 117 converts the nuclear magnetic resonance signal, which has been converted into the digital signal, into an image or a spectrum chart that is to be supplied for medical diagnosis and stores the nuclear magnetic resonance signal in a built-in storage device (not shown in the diagrams) and also displays the nuclear magnetic resonance signal on the display 118.

In addition, a program for executing a predetermined imaging sequence, such as diffusion-weighted echo planar imaging, is stored in the storage device of the computer 117. The CPU in the computer 117 reads and executes the program to control the operation of the magnet control unit 109, the gradient magnetic field power amplifier 112, the high-frequency power amplifier 114, and the high-frequency amplifier circuit 116. Thus, it is possible to perform imaging according to the predetermined imaging sequence. In addition, a program for realizing a spectrum analysis function and the like are also included in the computer 117.

In addition, the computer 117 can perform remote monitoring of the MRI apparatus through the recording of the operating state of each unit or a communication control device (not shown in the diagrams).

The superconducting magnet 101 and the bed 119 are installed in an examination room 120 that is electromagnetically shielded. Since this prevents electromagnetic waves generated by external devices from being mixed into the detection coil 115 as noise, the quality degradation of the captured image is prevented.

The procedure of installing the MRI apparatus configured as described above in the medical institution or the like will be described.

The liquid helium 407 is supplied into the superconducting magnet 101 assembled at room temperature and is cooled to 42 Kelvin (−268.8° C.), and a permanent current is supplied to the superconducting magnet 101 to realize a closed loop. Accordingly, the superconducting magnet 101 is magnetized in advance. Due to the difference of thermal contraction rate between the superconducting wire of the superconducting magnet 101 and the resin, thermal contraction strain occurs in each member. For this reason, the work of releasing the thermal contraction strain is performed before installing the MRI apparatus in the medical institution or the like. This releasing work is called the training of the superconducting coil.

As a training method, a method of performing quenching forcibly by repeating the excitation and demagnetization of the superconducting magnet multiple times (at least 3 times), or making the overcurrent flow to the superconducting coil, or applying heat from the outside is used.

By performing this training in advance at the manufacturing site or the like before the MRI apparatus is installed in the medical institution or the like, the energy of thermal contraction strain of the superconducting coil is released. As a result, quenching after the MRI apparatus is installed in the medical institution or the like is prevented. In the present embodiment, a quenching prevention sequence is executed in order to prevent quenching that still occurs accidentally even if such training is performed.

(Operation Flow of an MRI Apparatus)

Figure 2:
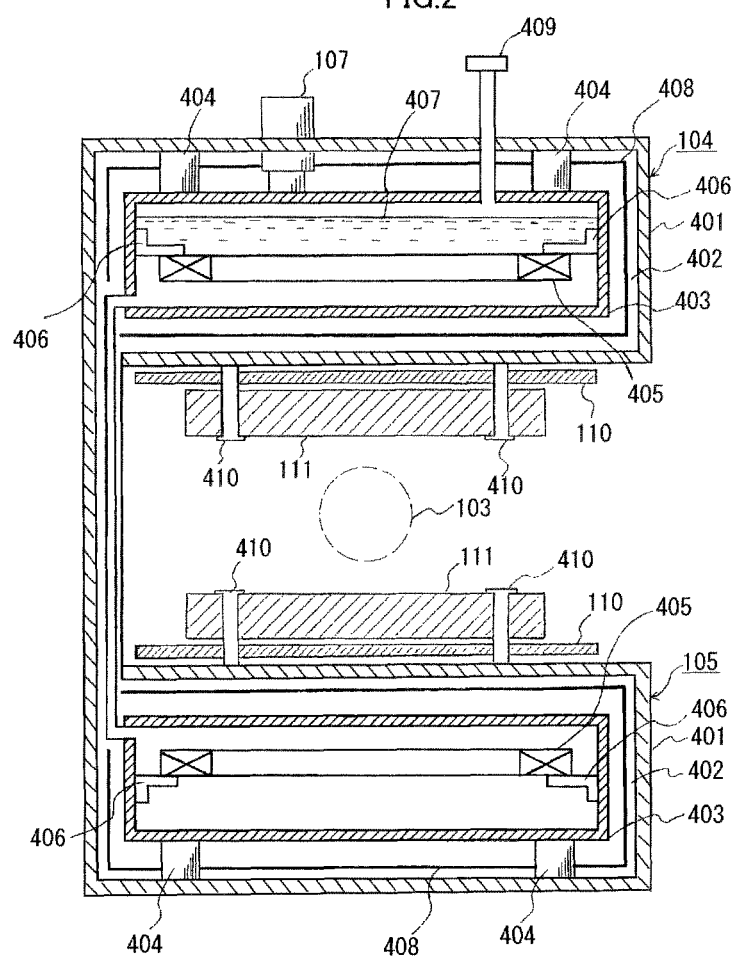
FIG. 2 is a cross-sectional view of a superconducting magnet of the MRI apparatus of the first embodiment.
Figure 3:
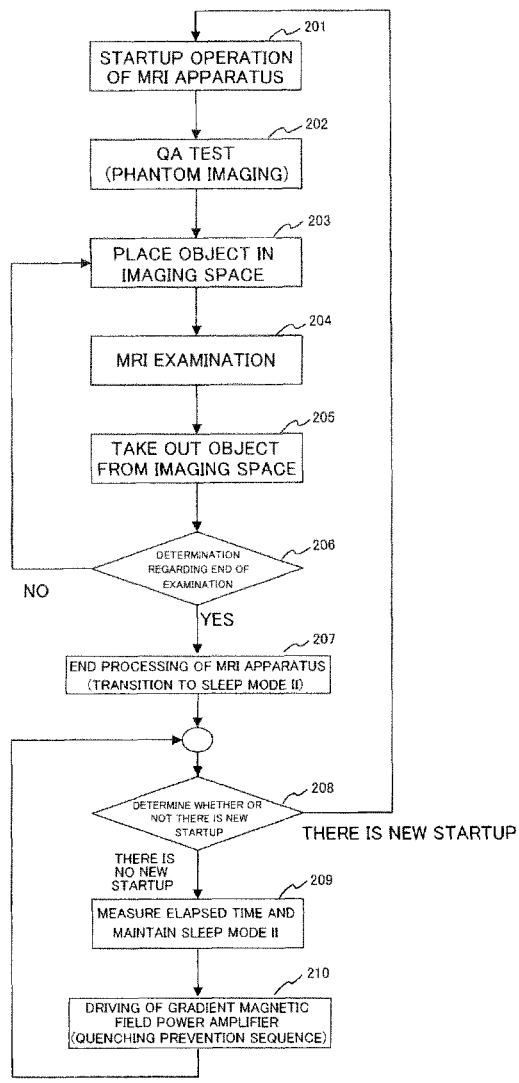
FIG. 3 is a flowchart showing the operation in the first embodiment of the present invention.

FIG. 3 is a flowchart showing the operation of the MRI apparatus shown in FIGS. 1 and 2.

The operation of the flow shown in FIG. 3 is realized when the computer 117 executes a program stored in advance in a built-in storage device. First, a predetermined startup operation of the MRI apparatus is performed at the start of the examination of the day (step 201). This startup operation is performed when the start switch is turned on by the operator or at the time reserved in the computer 117 in advance by the operator. As a startup operation, the computer 117 supplies electric power to each unit of the MRI apparatus in order to check the operation.

After the starting of the apparatus is completed, an imaging test called the Quality Assurance (QA) test is performed (step 202). This imaging test is a test in which the operator places a test sample called a phantom on the bed 119 and locates the test sample in the imaging space 103 and the computer 117 images the phantom according to a predetermined imaging sequence and analyzes the obtained image according to a predetermined program, thereby checking the signal to noise ratio, density uniformity, spatial resolution, positional accuracy of the image, and the like and adjusting the imaging conditions and the like. In some cases, it is also possible to omit the QA test (step 202).

After the QA test is completed, the operator places the first object 102 of the day on the bed 119, locates the examination part in the imaging space 103, and notifies the computer 117 of the completion of the placement by operating the operating unit. The computer 117 makes each unit execute an imaging sequence suitable for diagnosis set by the operator, thereby imaging the object 102 (steps 203 and 204). After the end of a series of examinations, the object 102 is taken out from the imaging space 103 by operating the bed 119 (step 205), and the MRI examination of the first object 102 is completed.

Then, the computer 117 proceeds to determination processing of the end of today's examination, and displays on the display 118 a display asking the operator whether or not the today's examination has ended (step 206). When the operator inputs "Yes" through input means (not shown), that when the MRI examination of the day has ended, the process proceeds to the end processing of the MRI apparatus (step 207). When the operator inputs "No", that is, when the next object 102 is waiting, the process returns to step 203 to place the next object 102 on the bed 119 and locate the examination part in the imaging space 103.

The end processing of step 207 is not turning off all units of the MRI apparatus but transitioning to a state in which the operating state of some functions is continued. This state is called a sleep mode in general, and the operating state of a monitoring function to monitor some units of the MRI apparatus, a cooling operation of the cryocooler 107, startup of step 201 by the timer, and a remote communication function is continued. In the present embodiment, in addition to these functions, the functions of the gradient magnetic field power amplifier 112 and a quenching prevention unit 117a of the computer 117, which is for making the gradient magnetic field power amplifier 112 operable in a predetermined quenching prevention sequence to be described later, are continued. This function is called a sleep mode II.

Here, a case where the timing, at which the computer 117 operates the gradient magnetic field power amplifier 112 according to the quenching prevention sequence in the sleep mode II, is set at fixed periods (for example, 1 hour) set in advance will be described below. However, it is also possible to execute the quenching prevention sequence at a certain timing instead of operating the gradient magnetic field power amplifier at fixed time intervals.

The computer 117 determines whether or not there has been new apparatus startup by the operator or whether or not there has been apparatus startup at the reserved time by the timer while maintaining the sleep mode II (step 208). When the reserved start time has come, the process returns to the first step 201 to perform a startup operation of the MRI apparatus. When there is no startup instruction from the operator, the sleep mode II is maintained by the MRI apparatus while measuring the elapsed time using a timer function programmed in the computer 117 (step 209).

Figure 4:
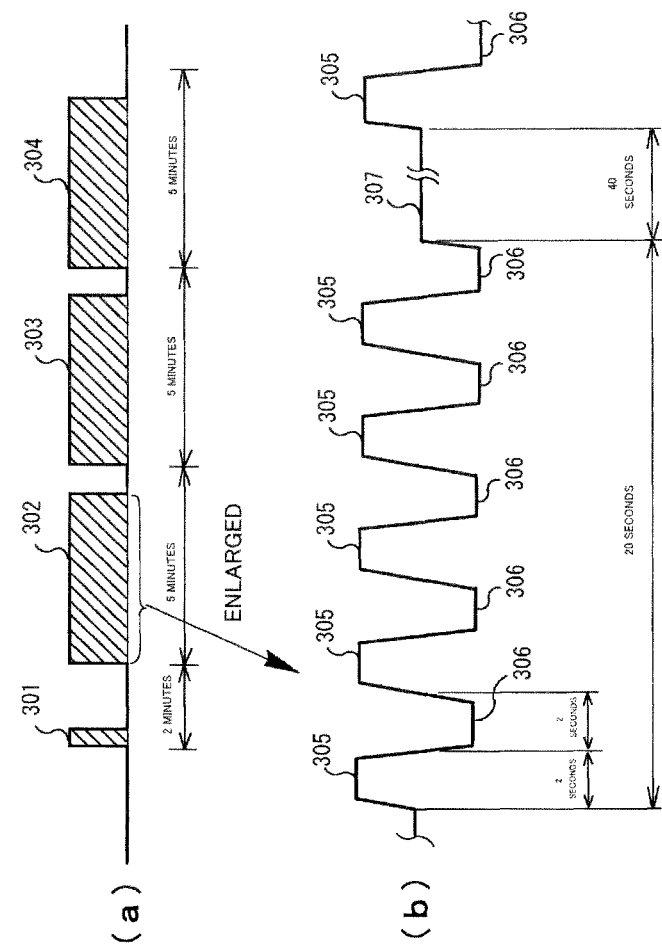
FIG. 4(*a*) is an explanatory view showing the driving sequence of a gradient magnetic field power amplifier of the quenching prevent ion sequence of the first embodiment, and FIG. 4(*b*) is an enlarged explanatory view illustrating a part of the driving sequence in detail.

If the timer measures that a predetermined time at which the quenching prevention sequence is to be executed, which is set by the operator, has passed while maintaining the sleep mode II, the process proceeds to step 210 in which the quenching prevention unit 117a in the computer 117 controls the gradient magnetic field power amplifier 112 so that the quenching prevention sequence shown in FIG. 4 is executed. As a result, an alternating gradient magnetic field shown in FIG. 4 is generated from the gradient magnetic field coil 111. The operation of the quenching prevention unit 117a in step 210 is realized when the CPU executes a program stored in the computer 117 in advance.

After executing the quenching prevention sequence in step 210, the computer 117 returns to step 208 while maintaining the sleep mode II again, in which it is determined whether or not there is new apparatus startup by the operator. By repeating the loop of step 208→step 209→step 210→step 208, the MRI apparatus generates a gradient magnetic field by driving the gradient magnetic field power amplifier 112 at fixed periods according to the quenching prevention sequence shown in FIG. 4 until the operator starts an apparatus or the apparatus is started by the timer.

(Quenching Prevention Sequence)

Here, the quenching prevention sequence performed in step 210 described above will be described with reference to FIGS. 4(a) and 4(b). In step 210, when a predetermined time has passed after proceeding to the state of sleep mode II in step 207, the quenching prevention unit 117a of the computer 117 outputs an activation signal 301 (refer to FIG. 4(a)) to the gradient magnetic field power amplifier 112 in order to execute the quenching prevention sequence. In response to the activation signal 301, the gradient magnetic field power amplifier 112 performs circulation of the cooling water of the gradient magnetic field coil 111 and self-circuit checking with its own power. As a result, a change to the standby mode is made in about 2 minutes. At this point in time, a control signal from the quenching prevention unit 117a of the computer 117 is transmitted again to the gradient magnetic field power amplifier 112, and the gradient magnetic field power amplifier 112 performs in order a period 302 for which a current is supplied to the x coil of the gradient magnetic field coil 111 in order to drive the x coil for a predetermined time (for 5 minutes), a period 303 for which a current is supplied to the y coil in order to drive the y coil for a predetermined time (for 5 minutes), and a period 304 for which a current is supplied to the z coil in order to drive the z coil for a predetermined time (for 5 minutes). The series of operations is the quenching prevention sequence, and is a sequence of 17 minutes.

As shown in detail in FIG. 4(b), during the period 302 for which the x coil is driven, a current pulse 305 of predetermined current value and time is supplied to the x coil first, and then a current pulse 306 with the opposite polarity to the current pulse 305 is supplied. For example, the current pulse 305 of +500 A is supplied for 2 seconds, and the current pulse 306 of −500 A is supplied for 2 seconds. An operation, in which the current pulse 305 and the current pulse 306 with the opposite polarity to the current pulse 305 are supplied repeatedly and alternately for a predetermined period (for example, 20 seconds), is repeated multiple times (for example, 5 times) with an idle period 307 (for example, 40 seconds) interposed between the repeated operations. As a result, in a period for which the current pulse 305 and the current pulse 306 are supplied repeatedly and alternately, a gradient magnetic field pulse in the x-axis direction and a gradient magnetic field pulse with the opposite gradient direction in the x-axis action are generated alternately and repeatedly by the x coil.

The driving period 303 of the y coil and the driving period 304 of the z coil are configured in the same manner as the driving period 302 of the x coil.

When a gradient magnetic field is generated by the gradient magnetic field coil 111, a repulsive force or an attractive force is generated between the superconducting coil and the gradient magnetic field coil 111. For example, when a gradient magnetic field is generated in a pair of upper and lower z coils, the upper z coil repels the superconducting coil 405 of the upper cryostat 104 electromagnetically, and the lower z coil generates an electromagnetic force attracting the superconducting coil 405 of the lower cryostat 105. When a gradient magnetic field is generated in a pair of x coils or y coils, the x coils and the y coils generate a repulsive force or an attractive force along the x axis and the y axis, respectively, since the x and y coils give gradients so as to change the density of the magnetic flux generated by the superconducting magnet 101 along the x and y axes (both are horizontal axes).

Therefore, when gradient magnetic field pulses with opposite gradient directions are generated by applying pulse currents with opposite polarities to the coils of the gradient magnetic field coil 111 in the respectively directions according to the quenching prevention sequence shown in FIG. 4, vibration will occur in the gradient magnetic field coil 111 and the superconducting coil 405. In the gradient magnetic field coil 111 and the superconducting coil 405, vibration due to elastic deformation occurs with a point fixed to the vacuum container 401 and the helium container 403 as a node.

For the superconducting coil 405, a superconducting wire (about 1 mm ϕ) is wound at room temperature, and the gap is filled with resin (for example, thermosetting epoxy resin) and the resin is fixed. When the superconducting coil 405 is fixed into the helium container 403 and is then cooled to 4.2 Kelvin (−268.8° C.), strain due to thermal contraction in the cooling process occurs in the superconducting wire and the resin. Although this strain is released by the training before installation described above, creeping of the resin progresses gradually since the strain cannot be released completely.

In this state, when the quenching prevention sequence is executed at fixed periods (for example, 1 hour) in step 210 to generate elastic deformation vibration in the superconducting coil 405, creep strain due to thermal contraction and elastic strain due to vibration are superimposed in the resin of the superconducting coil 405. Resin reduces this strain by causing small cracks. As a result, further progress of creeping is suppressed.

Although a temperature rise occurs due to the generation of small cracks, the temperature rise is small since the energy of small cracks is small. Therefore, even in the superconducting coil with high energy stored therein, the critical temperature at which the superconducting wire transitions to the normal conducting state is not exceeded. Thus, by causing a small crack according to the quenching prevention sequence before the creep causing a large crack is accumulated, a large crack can be prevented. Therefore, it is possible to prevent accidental quenching.

Thus, since it is possible to prevent accidental quenching from occurring in the MRI apparatus that is installed in a medical facility or the like and the superconducting state is maintained for a long time, it is possible to prevent a problem in that the MRI apparatus cannot be used due to the occurrence of accidental quenching or a problem of maintenance costs for realizing the superconducting state again. As a result, it is possible to stabilize the MRI apparatus, improve the reliability of the examination using the MRI apparatus, and reduce the cost.

In addition, the MRI apparatus of the present embodiment can execute the quenching prevention sequence by changing the software configuration without changing the hard configuration of the apparatus.

In the present embodiment, the quenching prevention sequence is executed at fixed time intervals by the MRI apparatus after proceeding to the sleep mode II. However, also when the waiting time until the MRI examination of the next object starts after the end of the MRI examination of the first object is 1 hours or more, the quenching prevention sequence may be executed. In this case, since the vibration sound generated when the gradient magnetic field coil is driven other than the time of imaging according to the quenching prevention sequence may surprise the object or the operator who is still placed on the bed 119, measures for preventing this can be included in the program.

As a first measure, it is possible to make a pre-announcement for the object 102 or the operator.

Usually, a communication device for telling the object the necessary information associated with the examination is provided in the MRI apparatus. Therefore, the computer 117 can transmit the generation of noise according to gradient magnetic field driving through the communication device before step 210 in which the quenching prevention sequence is executed. A display indicating that the noise according to gradient magnetic field driving has been generated can be displayed on the display 118. As a second measure, it is possible to avoid executing the quenching prevention sequence while the object or the operator is in the examination room. For example, by determining the presence of a moving object by image analysis of the computer 117 using an image of a patient monitoring camera provided in the MRI apparatus or a camera disposed in the examination room, it is possible to detect automatically that the object 102 is placed on the bed 119 or that the object or the operator is in a range of a predetermined distance from the examination room or the superconducting magnet 101. In this case, it is possible to delay the execution of the quenching prevention sequence.

Although the quenching prevention sequence shown in FIG. 4 is configured to drive the x coil, the y coil, and the z coil in order, the quenching prevention sequence of the present invention is not limited to the sequence shown in FIG. 4, and it is also possible to use a sequence of driving the x coil, the y coil, and the z coil simultaneously or to use a sequence of driving any two types of coils of the x coil, the y coil, and the z coil simultaneously. Also in this case, the same quench prevention effect is expected. In addition, the number of times of pause or the number of repetitions of the current pulses 305 and 306 with opposite polarities can also be changed to the arbitrary number of times.

This will be described below.

Since the quenching prevention sequence shown in FIG. 4 is an example in which the current pulse 305 of +500 A for 2 seconds and the current pulse 306 of −500 A for 2 seconds are alternately applied to the gradient magnetic field coil 111, the current pulse includes a fundamental wave with a frequency of 0.25 Hz and its harmonics.

On the other hand, the superconducting magnet 101 having the structure shown in FIG. 2 has a resonance frequency determined by the structure, and it is known from the computer analysis or the actual vibration test that the resonance frequency of the superconducting coil 405 provided in the superconducting magnet 101 is 8 Hz, 25 Hz, and 45 Hz.

Therefore, it is possible to make the gradient magnetic field act as a more effective vibration source by designing the current pulse of the quenching prevention sequence such that the frequency of the current pulse of the quenching prevention sequence matches the resonance frequency of the superconducting magnet 101 or the harmonic of the frequency of the current pulse matches the resonance frequency. As an example, it is possible to vibrate the superconducting coil 405 in the superconducting magnet 101 effectively by adopting the sequence in which the gradient magnetic field power amplifier 112 is driven by the alternating current pulse of, for example, 100 A.

Second Embodiment

Although the quenching prevention sequence is configured to vibrate the gradient magnetic field coil 111 by supplying the alternating current to the gradient magnetic field coil 111 in the first embodiment, a quenching prevention device is attached to the MRI apparatus in a second embodiment. As a quenching prevention device, a vibration generating coil 501 for executing the quenching prevention sequence is provided apart from the gradient magnetic field coil 111.

Figure 5:
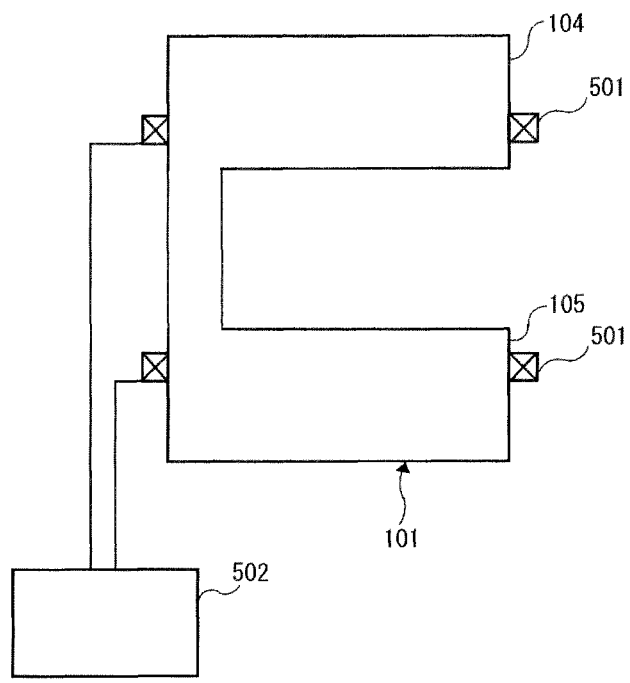
FIG. 5 is a block diagram showing the configuration of a quenching prevention device of a second embodiment.

That is, as shown in FIG. 5, a gradient magnetic field coil for vibration 501 (hereinafter, referred to as a vibration generating coil) of the quenching prevention device is attached onto the external surface of each vacuum container 401 of the upper cryostat 104 and the lower cryostat 105 of the superconducting magnet 101. The quenching prevention device includes a dedicated current supply unit (hereinafter, referred to as a driving power supply) 502 connected to the vibration generating coil 501.

The driving power supply 502 includes an amplifier circuit that applies a current, which is required for the vibration generating coil 501, to the vibration generating coil 501 and a timer circuit for operating the amplifier circuit at predetermined time intervals. When the operator turns on the switch of the driving power supply 502 or the computer 117 turns on the switch of the driving power supply 502 after the end of the MRI examination, the amplifier circuit supplies the alternating current of a predetermined frequency (for example, 0.25 Hz that is a fundamental frequency) to the vibration generating coil 501, for example, every hour to vibrate the vibration generating coil 501. In this manner, it is possible to execute the quenching prevention sequence.

In general, the gradient magnetic field coil 111 of the MRI apparatus is designed to avoid electromagnetic interference with the superconducting magnet 101 as much as possible, the gradient magnetic field coil 111 has a structure that is hard to cause vibration in the superconducting coil. The reason is that a shield coil is disposed together with the gradient magnetic field coil 111 in many cases and accordingly a required gradient magnetic field is generated effectively in the imaging space 103, but the shield coil shields actively the generation of a gradient magnetic field in space of the cryostat other than the imaging space.

According to the second embodiment, since the vibration generating coil 501 that is different from the gradient magnetic field coil 111 is used, it is possible to dispose the vibration generating coil 501 at the optimal position in accordance with the position of the superconducting coil 405 or attach the vibration generating coil 501 in a direction in which vibration is to be given. Therefore, it is possible to cause the superconducting coil 405 to vibrate effectively.

In addition, in the configuration of the second embodiment, the vibration generating coil 501 and the driving power supply 502 can be disposed as a separate configuration from the MRI apparatus. Therefore, by attaching these to the existing MRI apparatus, it is also possible to prevent accidental quenching of the existing MRI apparatus.

In addition, although the vibration generating coil 501 is attached to the superconducting magnet 101 in FIG. 5, the attachment position is not limited to this position. That is, it is possible to attach the vibration generating coil 501 to the wall of the room where the superconducting magnet 101 is installed, or it is possible to attach the vibration generating coil 501 to the bed 119 and place the vibration generating coil 501 at the center of the superconducting magnet 101 in the same operation as the loading of the object 102.

Third Embodiment

In a third embodiment, a phantom imaging sequence is executed as the quenching prevention sequence.

FIG. 6 shows the operation flow of an MRI apparatus of a third embodiment. In the flow shown in FIG. 6, steps 201 to 206 are the same as steps 201 to 206 in the first embodiment.

When the operator inputs the end of the examination in step 206, the process proceeds to step 601 in which the computer 117 displays a display, which prompts the operator to place a phantom in the imaging space 103, on the display 118. The operator places the phantom on the bed 109 and locates the bed 109 in imaging space while viewing the display, and inputs the end of the placement to the computer 117 using an operating unit or the like. In response to this, the computer 117 performs an operation for end processing II of the MRI apparatus. When the operator inputs "No" in step 206, the process returns to step 203.

As an operation for the and processing II of the MRI apparatus in step 601, transition to a sleep mode III is performed. The sleep mode III is a mode in which the operating state of a monitoring function to monitor some units of the MRI apparatus, a cooling operation of the cryocooler 107, start by the timer, and a remote communication function is continued while continuing a timer function for capturing a phantom image by restarting the MRI apparatus at the required timing.

The computer 117 determines whether or not there is new apparatus startup while maintaining the sleep mode III (step 208). When there is a startup instruction, the process returns to the first step 201. When there is no startup instruction, the sleep mode III is maintained while measuring the elapsed time using a timer function programmed in the computer 117 (step 602). For example, the process proceeds to the next step 603 after one hour has passed by the program.

In step 603, the quenching prevention unit 117a of the computer 117 captures an image of the phantom according to an imaging sequence, which is programmed in advance, as a quenching prevention sequence.

After the end of capturing of the phantom image, the MRI apparatus returns to step 208, in which processing for determining whether or not there is new apparatus startup is performed, while maintaining the sleep mode III again. By the loop of step 208→step 602→step 603→step 208, the MRI apparatus captures a phantom image every hour.

In step 603, since a phantom image is captured as a quenching prevention sequence, the computer 117 can store the image in a built-in storage device. By setting the phantom imaging sequence of the quenching prevention sequence as the same sequence as the phantom imaging sequence of the QA test in step 202, the quenching prevention sequence in step 603 can also serve as the imaging sequence of the QA test in step 202. Therefore, it is possible to omit the phantom imaging of the QA test in step 202. In step 202, the phantom image captured in step 603 is analyzed to perform the QA test. Therefore, it is possible to shorten the time from the start of step 201 to the imaging of the object 102 in step 204.

In addition, since a plurality of phantom images are captured at fixed time intervals, it is possible to check a temporal change of the MRI apparatus using the image analysis method.

Although the case where the superconducting magnet has an open structure has been described in the above embodiments, the quenching prevention sequence of the present embodiment can also be applied to superconducting magnets having other shapes, such as a cylindrical shape.

REFERENCE SIGNS LIST

101: superconducting magnet
102: object
103: imaging space
109: magnet control unit
110: shim plate
111: gradient magnetic field coil
112: gradient magnetic field power amplifier
113: high-frequency coil
114: high-frequency power amplifier
115: detection coil
116: high-frequency amplifier circuit
117: computer
117a: quenching prevention sequence execution unit (quenching prevention unit)
301: activation signal
302: x coil driving period
303: y coil driving period
304: z coil driving period
305: +500 A pulse
306: −500 A pulse
401: vacuum container
402: vacuum layer
403: helium container
404: load support
405: superconducting coil
406: support bracket
410: fixing bolt
501: vibration generating coil
501: driving power supply

The invention claimed is:

1. A magnetic resonance imaging apparatus, comprising:
a superconducting magnet;
a gradient magnetic field coil that applies a gradient magnetic field to imaging space;
a high-frequency coil that applies a high-frequency magnetic field to the imaging space;
a control unit that controls operations of the gradient magnetic field coil and the high-frequency coil to execute a predetermined imaging sequence; and
a quenching prevention sequence execution unit that executes a quenching prevention sequence to vibrate the superconducting magnet in a time period for which the control unit does not execute the imaging sequence.

2. The magnetic resonance imaging apparatus according to claim 1,
wherein the quenching prevention sequence is a sequence of applying a gradient magnetic field to the superconducting magnet by driving the gradient magnetic field coil.

3. The magnetic resonance imaging apparatus according to claim 1,
wherein the quenching prevention sequence execution unit includes a coil for vibration, which applies a gradient magnetic field for vibrating the superconducting magnet to the superconducting magnet, apart from the gradient magnetic field coil, and
the quenching prevention sequence vibrates the coil for vibration.

4. The magnetic resonance imaging apparatus according to claim 1,
wherein the quenching prevention sequence is a sequence of applying alternating gradient magnetic fields with opposite gradient directions to the superconducting magnet.

5. The magnetic resonance imaging apparatus according to claim 4,
wherein a frequency of each of the alternating gradient magnetic fields or a frequency of the harmonic matches a resonance frequency of the superconducting magnet.

6. The magnetic resonance imaging apparatus according to claim 1,
wherein the quenching prevention sequence is an imaging sequence.

7. The magnetic resonance imaging apparatus according to claim 6,
wherein the control unit executes a phantom imaging sequence of capturing a phantom and performing predetermined image analysis before executing the predetermined imaging sequence, and
the quenching prevention sequence is executed under the same imaging conditions as the phantom imaging sequence.

8. The magnetic resonance imaging apparatus according to claim 6,
wherein the quenching prevention sequence also serves as a phantom imaging sequence, and the control unit performs the image analysis using an image captured by the quenching prevention sequence.

9. The magnetic resonance imaging apparatus according to claim 1,
wherein the quenching prevention sequence execution unit executes the quenching prevention sequence repeatedly at predetermined time intervals.

10. The magnetic resonance imaging apparatus according to claim 1,
wherein the quenching prevention sequence execution unit notifies an object or an operator that the quenching prevention sequence is about to be executed before executing the quenching prevention sequence.

11. The magnetic resonance imaging apparatus according to claim 1,
wherein the quenching prevention sequence execution unit includes a detection section configured to detect that an object or an operator is in a predetermined range around the superconducting magnet before executing the quenching prevention sequence.

12. The magnetic resonance imaging apparatus according to claim 11,
wherein, when the detection section detects that an object or an operator is in the range, the execution of the quenching prevention sequence is delayed.

13. A magnetic resonance imaging apparatus, comprising:
a superconducting magnet;
a gradient magnetic field coil that applies a gradient magnetic field to imaging space;
a high-frequency coil that applies a high-frequency magnetic field to the imaging space; and
a control unit that controls operations of the gradient magnetic field coil and the high-frequency coil to execute a predetermined imaging sequence,
wherein the control unit executes a predetermined imaging sequence for vibration in order to vibrate the superconducting magnet in a time period for which the imaging sequence is not executed.

14. An operation method of a magnetic resonance imaging apparatus that includes a superconducting magnet and images an object by executing a predetermined imaging sequence, the operation method comprising:
vibrating the superconducting magnet in order to prevent quenching of the superconducting magnet in a time period for which the predetermined imaging sequence is not executed.

15. The operation method of a magnetic resonance imaging apparatus according to claim 14,
wherein the magnetic resonance imaging apparatus includes a gradient magnetic field coil, and the superconducting magnet is vibrated by generating a gradient magnetic field in the gradient magnetic field coil in order to prevent the quenching.

16. The operation method of a magnetic resonance imaging apparatus according to claim 14,
wherein the magnetic resonance imaging apparatus includes a gradient magnetic field coil for vibration, which generates a gradient magnetic field in order to apply the gradient magnetic field to the superconducting magnet, apart from a gradient magnetic field coil used in the imaging sequence, and
the superconducting magnet is vibrated by generating a gradient magnetic field in the gradient magnetic field coil for vibration.

17. An operation method of a magnetic resonance imaging apparatus that includes a superconducting magnet and images an object by executing a predetermined imaging sequence, the operation method comprising:
imaging a phantom in order to prevent quenching of the superconducting magnet in a time period for which the predetermined imaging sequence is not executed, and
executing a quenching prevention sequence to vibrate the superconducting magnet in a time period for which the imaging sequence is not being executed.

18. An operation method of a magnetic resonance imaging apparatus including a superconducting magnet, the operation method comprising:
a step of imaging an object by applying an imaging sequence;
a step of performing an operation to pause the imaging; and
a step of executing a quenching prevention sequence to vibrate the superconducting magnet after the pause operation is performed and in a time period for which the imaging sequence is not being executed.

19. A quenching prevention device of a magnetic resonance imaging apparatus including a superconducting magnet, comprising:
a gradient magnetic field coil for vibration that generates a gradient magnetic field for vibrating the superconducting magnet;
a current supply unit that performs an operation, which is for supplying an alternating current to the gradient magnetic field coil for vibration for a predetermined time, repeatedly at predetermined time intervals; and
a quenching prevention sequence execution unit that executes a quenching prevention sequence to vibrate the superconducting magnet in a time period for which the magnetic resonance imaging apparatus does not execute an imaging sequence.

20. A magnetic resonance imaging apparatus, comprising:
a superconducting magnet;
a gradient magnetic field coil that applies a gradient magnetic field to imaging space;
a high-frequency coil that applies a high-frequency magnetic field to the imaging space; and
a control unit that controls operations of the gradient magnetic field coil and the high-frequency coil to execute a predetermined imaging sequence; and
a quenching prevention sequence execution unit that executes a quenching prevention sequence to vibrate the superconducting magnet in a time period for which the control unit does not execute the imaging sequence,
wherein either the imaging sequence or the quenching prevention sequence is executed in a period of ¾ or more of a day.

* * * * *